(12) United States Patent
Peck

(10) Patent No.: US 6,807,220 B1
(45) Date of Patent: Oct. 19, 2004

(54) RETENTION MECHANISM FOR HEATING COIL OF HIGH TEMPERATURE DIFFUSION FURNACE

(75) Inventor: Kevin B. Peck, Sonora, CA (US)

(73) Assignee: MRL Industries, Sonora, CA (US)

( * ) Notice: Subject to any disclaimer, the term of this patent is extended or adjusted under 35 U.S.C. 154(b) by 0 days.

(21) Appl. No.: 10/444,128

(22) Filed: May 23, 2003

(51) Int. Cl.[7] .............................................. H05B 3/66
(52) U.S. Cl. ........................ 373/128; 219/402; 219/542; 373/5; 373/130
(58) Field of Search ............................. 373/5, 112, 109, 373/117–119, 127–130, 137; 219/390, 391, 402, 406, 483, 531, 532, 536, 542, 549; 174/138 J, 175; D13/131

(56) References Cited

U.S. PATENT DOCUMENTS

| | | |
|---|---|---|
| D34,503 S | 5/1901 | Brown |
| 1,698,282 A | 1/1929 | Simmons |
| 2,602,130 A | 7/1952 | Shaw |
| 3,043,942 A | 7/1962 | Wickwire, III et al. |
| 3,846,619 A | 11/1974 | Wightman et al. |
| 3,935,376 A | 12/1974 | Cooper et al. |
| 3,953,376 A | 4/1976 | Kern |
| D248,943 S | 8/1978 | King |
| D258,877 S | 4/1981 | King |
| D261,260 S | 10/1981 | Seeley |
| 4,341,916 A * | 7/1982 | Byrd et al. .................. 373/128 |
| 4,418,415 A * | 11/1983 | Raymond ................... 373/130 |
| 4,528,441 A | 7/1985 | Seal et al. |
| 4,531,017 A | 7/1985 | Sherrill |
| 4,692,599 A | 9/1987 | Howard et al. |
| 5,095,192 A * | 3/1992 | McEntire et al. ........... 219/402 |
| 5,187,771 A | 2/1993 | Uchida |
| 5,880,440 A | 3/1999 | Whitfield et al. |
| 5,959,254 A | 9/1999 | Martin, Sr. |
| 6,285,013 B1 | 9/2001 | Holmes |
| 6,376,814 B2 | 4/2002 | Holmes |

* cited by examiner

*Primary Examiner*—Tu Hoang
(74) *Attorney, Agent, or Firm*—Burns, Doane, Swecker & Mathis, L.L.P.

(57) ABSTRACT

A heating assembly for use in an electric furnace includes a helical heating element encircled by thermal insulation, and rows of spacers for keeping turns of the heating element spaced apart by predetermined distances. Each spacer includes circumferential side portions facing generally in a circumferential direction of the heating element and converging toward a center region of the spacer to form a radial undercut against which the insulation abuts. The spacers of each row have through holes extending parallel to a longitudinal axis of the heating element. A guide rod extends through the through holes of each row of spacers.

15 Claims, 7 Drawing Sheets

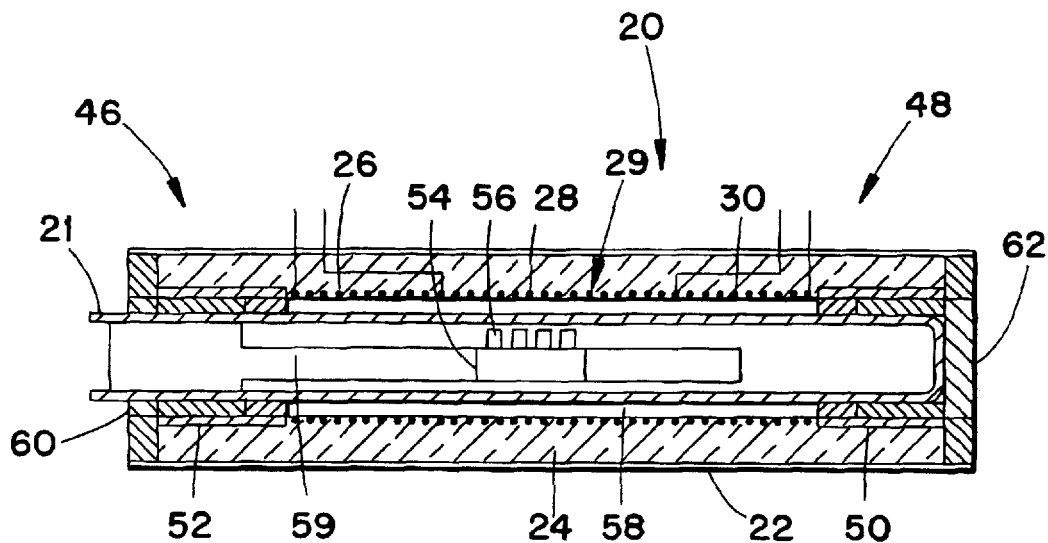
FIG. 1
(PRIOR ART)
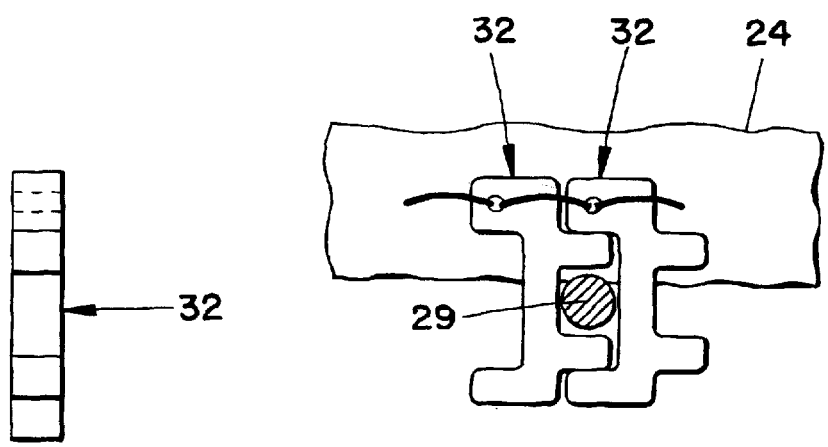
FIG. 3
(PRIOR ART)
FIG. 2
(PRIOR ART)

RETENTION MECHANISM FOR HEATING COIL OF HIGH TEMPERATURE DIFFUSION FURNACE

BACKGROUND OF THE INVENTION

The present invention is directed to a high temperature diffusion furnace such as that used in the semiconductor industry to heat semiconductor wafers so that, for example, the wafers can be doped with an appropriate material. In particular, the invention pertains to a retention mechanism which maintains a desired configuration of a helical wound resistive wire.

High temperature diffusion furnaces are well known to the semiconductor industry (e.g., see U.S. Pat. Nos. 5,038,019, No. 5,461,214, and No. 6,512,206, the disclosures of which are incorporated herein by reference). Heat treatment in high temperature diffusion furnaces is a part of the manufacturing process of silicon wafers whereby, for example, doping elements such as boron can be introduced into the molecular structure of the semiconductor material. Heating cycles for the furnaces must be controlled accurately with respect to time and temperature. There is also a requirement that the diffusion furnace be made durable enough to withstand repeated heating and cooling cycles. Further, for purposes of the manufacturing processes, it is important that the diffusion furnace quickly reach the desired temperature, maintain the temperature for a preselected period of time and then quickly reduce the temperature to the desired level.

In actual practice, the diffusion furnaces used in the semiconductor industry are substantially cylindrical in shape. All diffusion furnaces are equipped with a process tube in which the silicon wafers are processed. The process chamber is fabricated of quartz, polysilicon, silicon carbide or ceramic and is inserted into the diffusion furnace.

As shown in FIG. 1, a prior art diffusion furnace 20 includes an outer metallic housing 22, usually comprised of stainless steel or aluminum and inner layers 24 of insulating materials such as ceramic fiber. Several helical heating coils 26, 28 and 30 are secured together to form one continuous helical element 29, with the middle heating coil 28 operated at the optimal temperature and the end heating coils 26, 30 operated at a temperature sufficient to overcome thermal losses out of the end of the furnace and to preheat any gases being introduced into the process chamber of the furnace which can comprise one or more process zones. The heating element is generally a helically coiled resistance wire made of a chrome-aluminum-iron alloy. The wire is generally heavy gauge (e.g., 0.289 inches to 0.375 inches in diameter) for longer heating element life at an elevated temperature.

As can be seen in FIG. 1, at either end of the furnace 20 is a vestibule 46, 48. The vestibules 46, 48 are counterbored to accept end blocks 60, 62 which are sized to fit the process chamber 21. The process chamber 21 is suspended between the end blocks 60, 62. The silicon wafers 56 to be heat treated are mounted into boats 54, fabricated of quartz, polysilicon, silicon carbide or ceramic. The boats 54 are then loaded into the process chamber 21 for processing. The boats 54 may be slid manually or automatically into the process chamber 21 or suspended within the process chamber on cantilevered: support arms 59 constructed of silicon carbide or ceramic and quartz.

The maximum permissible operating temperature for the heating element alloy is around 1420° C. Since a temperature differential exists between the heating element and the inside of the process chamber, diffusion furnaces are normally operated at a maximum operating process chamber temperature of around 1300° C.

A coil-retention mechanism is provided to separate and hold in place the individual coil turns of the helical heating element 29. Maintenance of the correct separation between each coil turn is critical to the operation of the furnace which normally requires a maximum temperature differential of not more than plus or minus ½ C., along the entire length of the process zone. Electrical shorting between turns and interference with uniform heat distribution can result if the gaps between the coil turns are varied. The retention mechanism typically comprises rows of ceramic spacers, such as spacers 32 shown in FIG. 2. The rows extend parallel to the longitudinal axis of the helical heating element and are spaced apart around the circumference of the heating element.

Generally the insulation 24 is comprised of a ceramic fiber insulating material having about 50% alumina or more and the balance silica. This insulating material is applied to the exterior of the heating element after the coil turns are positioned within the spacers. The insulation is applied either as a wet or dry blanket wrapped around the heating element or is vacuum formed over the element. After the insulation has dried, sections of the insulation disposed between the rows of spacers cooperate with the spacer rows to keep the coil turns of the helical heating element 29 properly aligned.

As indicated above, the operating temperature of the furnace is generally over 1000° C. The furnace typically cycles between temperatures of approximately 800° C. when the boats are loaded into the furnace process chamber and over 1000° C. during full operation. As indicated above, it is imperative that the furnace quickly reach the operating temperature and quickly cool down after operation.

Failure of these prior furnaces 20 is often due to the inability to control the growth or expansion of the heating element, the inability to prevent failure of the ceramic fiber insulation, the inability of the spacers to properly maintain the spacing of the individual coils of the heating element, and the combined effect of these occurrences, resulting in coil sag.

A problem occurring with insulation involves a tendency for the insulation to shrink with age and temperature changes. As a result, gaps can form between the spacer rows and the insulation sections disposed between the spacer rows as those shrinking sections pull away from the spacer rows in the circumferential direction. The gaps are oriented radially with respect to the coil, thereby forming direct paths through which radiant heat loss can occur.

Another problem results from a lack of sufficient support for the endmost turns of the heating coil, enabling those ends to sag and produce premature failure of the coil.

SUMMARY OF THE INVENTION

The present invention relates to an electric furnace which comprises a helical heating element, and rows of spacers for maintaining a spacing between adjacent turns of the heating element, each row of spacers extending from one end of the heating element to an opposite end of the heating element, the rows of spacers being circumferentially spaced apart with reference to a center axis of the heating element, each spacer including circumferentially facing side surfaces defining radial undercuts. Thermal insulation extends around the outside of the heating element. The insulation includes circumferentially spaced portions each disposed within a respective space defined between two adjacent rows of spacers and engaging the radial undercuts of the spacers of the two rows.

Another aspect of the invention relates to an electric furnace having a helical heating element encircled by insulation, and rows of spacers for keeping turns of the heating element spaced apart by predetermined distances. Each spacer includes circumferential side portions facing generally in a circumferential direction of the heating element and converging toward a center region of the spacer to form a radial undercut against which the insulation abuts. The spacers of each row have through holes extending parallel to a longitudinal axis of the hating element. A guide rod extends through the through holes of each row of spacers.

Yet another aspect of the invention relates to a spacer for spacing apart the turns of a helical heating element. The spacer comprises a pair of oppositely facing first side surfaces, and a pair of oppositely facing second side surfaces. One of the first side surfaces includes a pair of projections spaced apart in a first direction. The other of the first side surfaces includes a recess sized to receive the projections. Portions of the second side surfaces converge in a second direction parallel to the first direction to form undercuts.

BRIEF DESCRIPTION OF THE DRAWINGS

The objects and advantages of the invention will become apparent from the following detailed description of A preferred embodiment thereof in connection with the accompanying drawings in which like numerals designate like elements and in which:

FIG. 1 is a longitudinal sectional view taken through a prior art furnace.

FIG. 2 is a view taken in a direction circumferentially (or tangentially) with respect to a longitudinal axis of a heating element of the furnace depicted in FIG. 1, depicting the manner in which conventional spacers retain the heating element.

FIG. 3 is a view of one of the spacers of FIG. 2 taken in a direction from the right in FIG. 2.

DESCRIPTION OF PREFERRED EMBODIMENTS OF THE INVENTION

Figure 4:
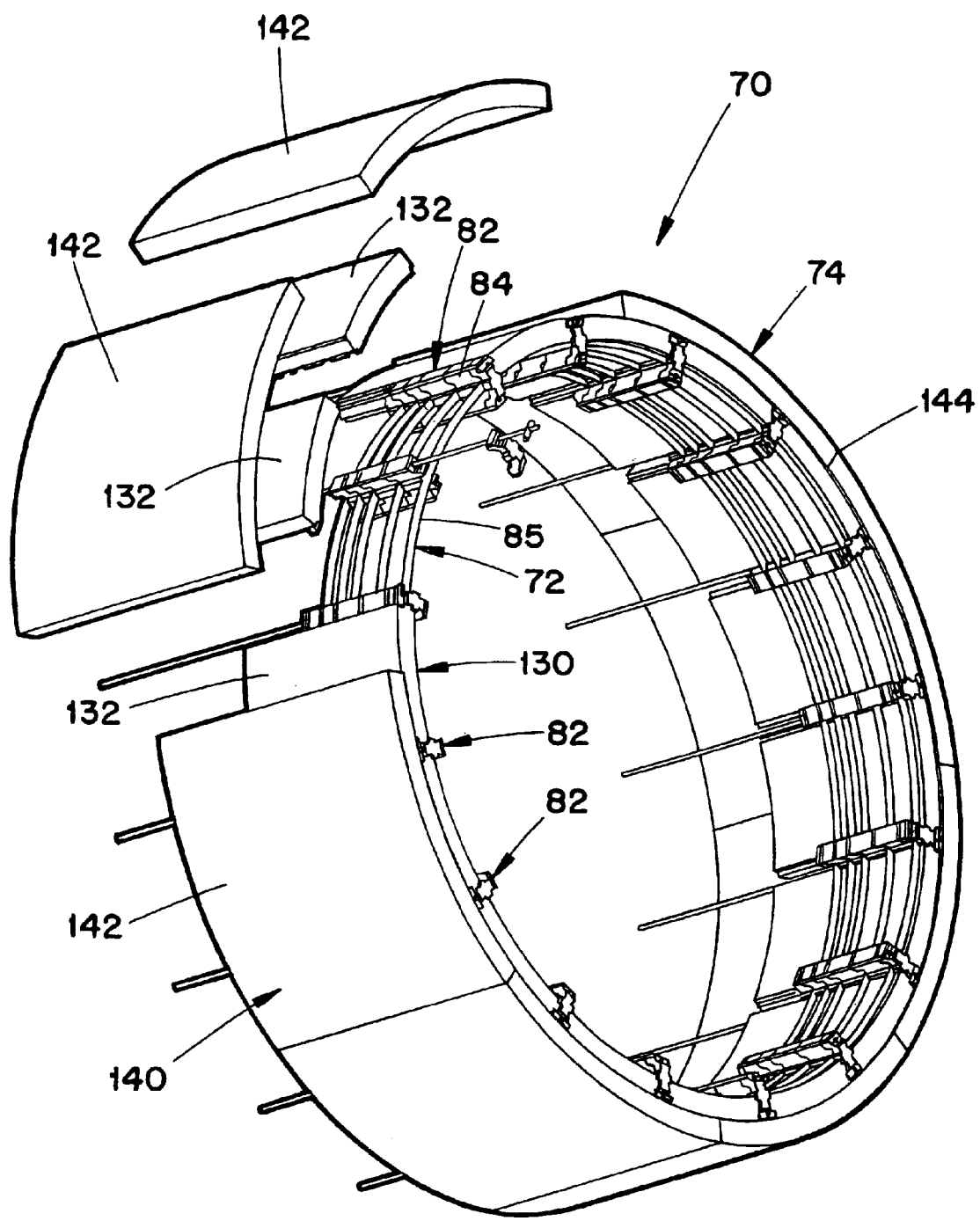
FIG. 4 is an exploded perspective view of a heating assembly according to the present invention which is adapted for use in a furnace of the type depicted in FIG. 1.

An insulated heating structure 70 according to the invention, generally depicted in FIG. 4, includes a helical heating coil element 72 which is surrounded by insulation 74. The coil element 72 can be the same as the coil element 29 described earlier. The heating structure 70 is adapted for use in the furnace described earlier in connection with FIG. 1, namely a diffusion furnace used in the semiconductor industry and which is a low voltage, high amperage furnace operating in a typical current range of between 70–130 amps.

A retention mechanism for the heating coil element is provided in the form of rows 82 of spacers 84. The rows extend parallel to the longitudinal axis of the heating coil element 72 and are arranged in substantially equally spaced relationship circumferentially about the heating coil element. The spacers, which will be described more fully herein below, are used to maintain the position of the individual loops or coils 102 of the heating element 72. The larger the diameter of the furnace, the more spacer rows 82 are required to maintain the position of the heating element 72.

Each spacer 84, shown in detail in FIGS. 9–12, comprises first and second longitudinally-facing sides 88, 90 which face in respective opposite directions oriented parallel to the longitudinal axis of the heating coil 72. The spacer also includes first and second circumferentially-facing sides 92, 94 which face in respective opposite directions oriented generally in a circumferential direction with reference to that longitudinal axis.

Figure 5:
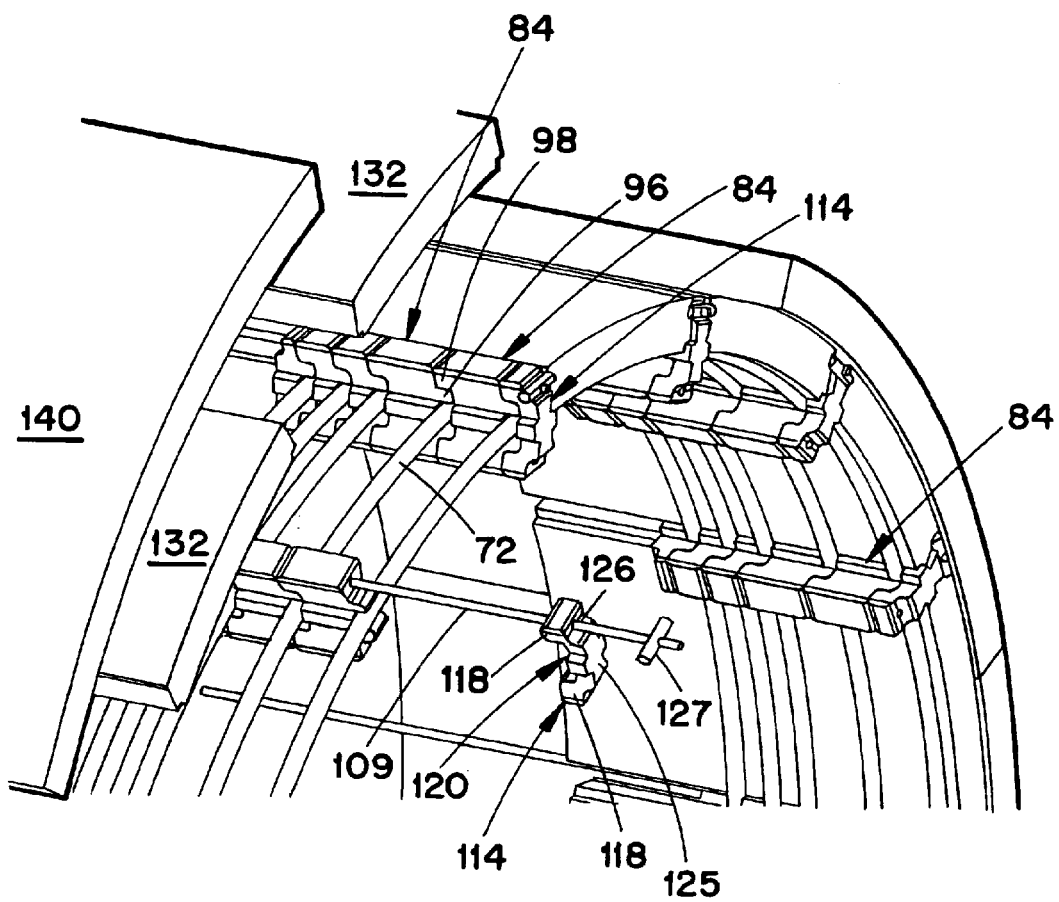
FIG. 5 is an enlarged fragmentary view of FIG. 4.
Figure 6:
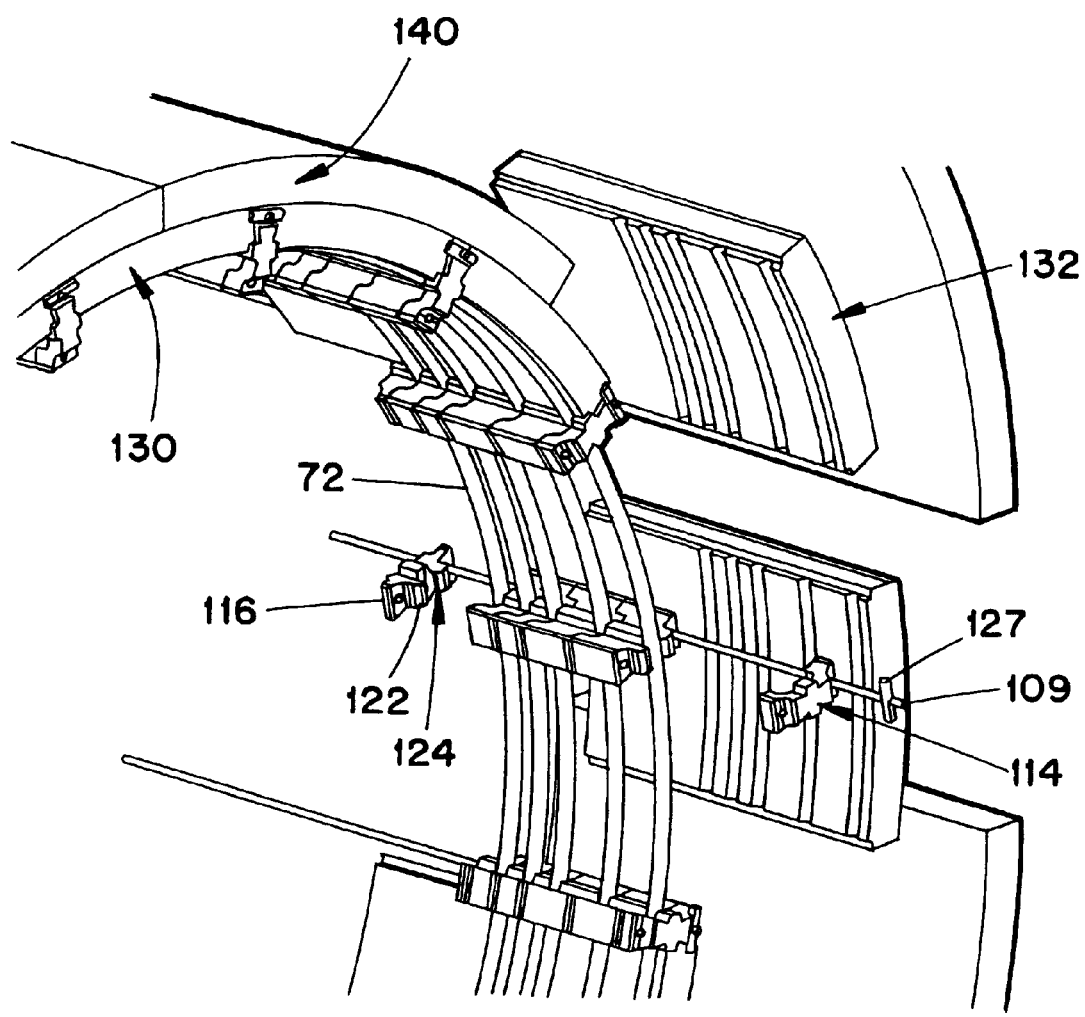
FIG. 6 is an exploded perspective fragmentary view of another portion of the heating assembly depicted in FIG. 5.
Figure 7:
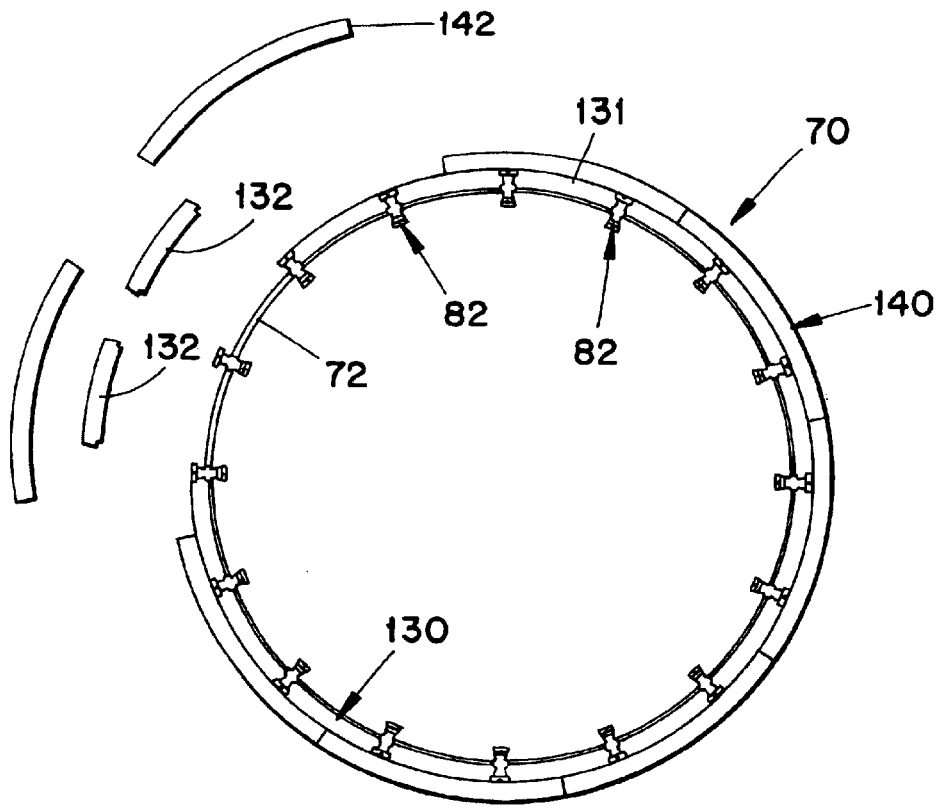
FIG. 7 is an exploded longitudinal end view of the heating assembly depicted in FIG. 5.

The first longitudinally-facing side 88 includes a first yoke structure comprising a pair of projections 96. The second longitudinally-facing side 90 includes a second yoke structure comprising a pair of second projections 98 defining therebetween a recess 100 sufficiently large to accommodate the first projections 96 more particularly, the projections 96 of an identical adjacent spacer 84, as shown in FIG. 5. The projections 96 form therebetween a smaller recess 101 sufficiently large to receive a turn of the heating element 72.

The spacer 84 is shaped symmetrically about a radial center plane A—A, so the first and second circumferentially-facing sides 92, 94 are identical, each including first and second side portions 102, 102' that are spaced apart in a direction extending radially with reference to a center axis of the heating element. The side portions 102 constitute radially outer side portions, and the side portions 102' constitute radially inner side portions.

Figure 8:
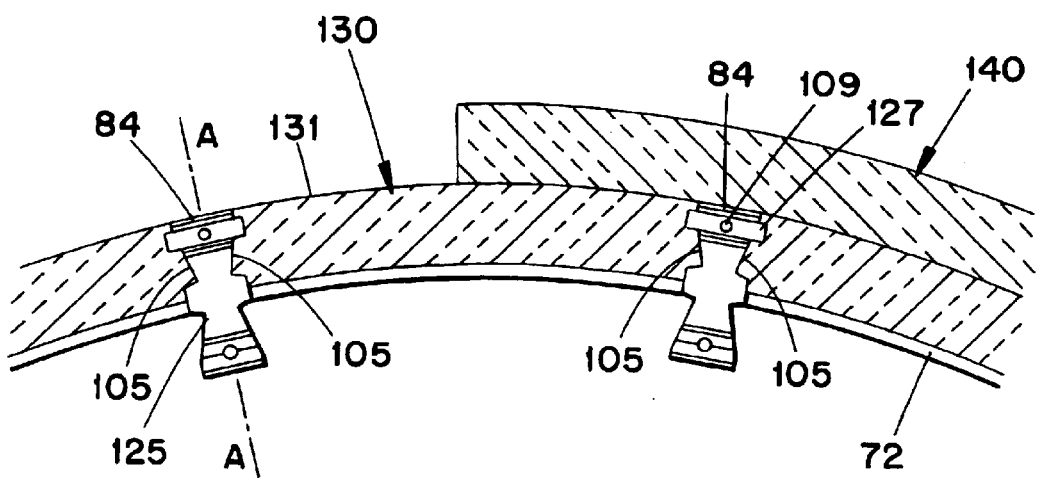
FIG. 8 is an enlarged fragmentary longitudinal end view of FIG. 7.
Figure 9:
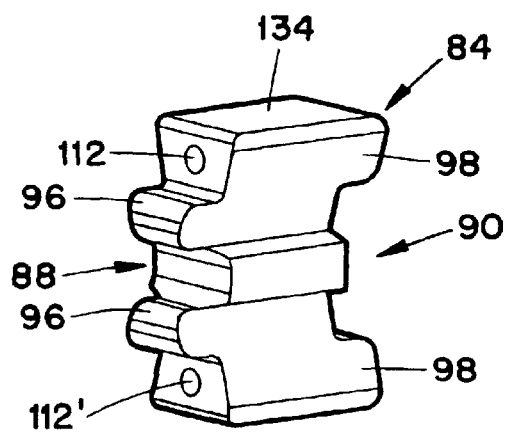
FIG. 9 is a perspective view of a spacer element according to the present invention.
Figure 10:
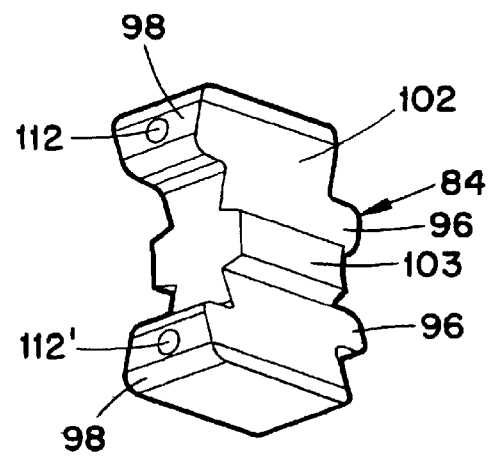
FIG. 10 is a perspective view of the spacer depicted in FIG. 9 taken in another direction.

The side portions 102 are inclined (beveled), wherein they are convergent generally toward a center region 103 of the spacer. In that way, each side portion 102 forms a radial undercut 105 as can be seen in FIG. 8. The same is true of the side portions 102.

By "radial undercut" is meant that a radially inner end of the side portion 102 is disposed closer to the radial center plane A—A than is a radial outer end of the same side portion.

Preferably, each side portion 102, 102' forms an acute angle a with a line T extending tangentially relative to a radius of the heating element, the angle α being 75° for example.

The radially outer side portions 102 are separated from the radially inner side portions 102' by a pair of wings 105 extending from a center region of the spacer. The wings 105 have beveled surfaces 107 which form an angle β with the respective side portion, e.g., an angle β of 90°.

The spacers 84 of each row 82 are held in mutual alignment by a guide rod 109 which extends parallel to the longitudinal axis of the heating element 72 and passes through holes 112 or 112' formed through the spacers 84.

Figure 13:
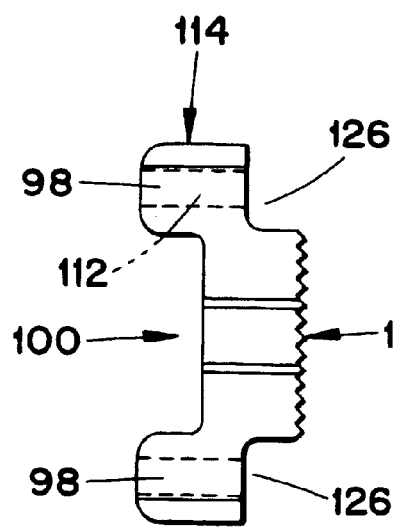
FIG. 13 is a side view of a modified end spacer.
Figure 14:
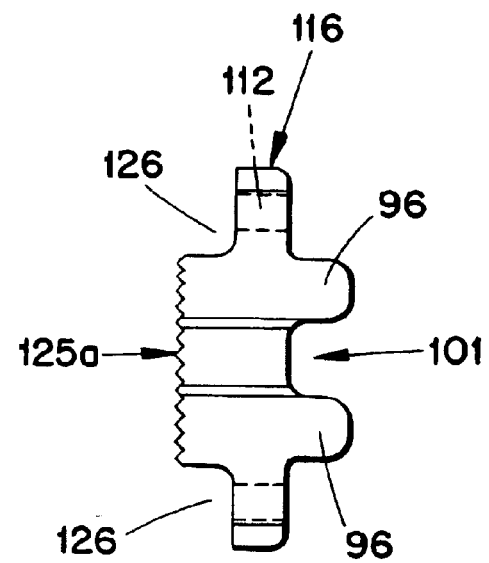
FIG. 14 is a side view of the opposite end spacer from that shown in FIG. 13, with a similar modification.

Each spacer row 82 includes first and second end spacers 114, 116 (see also FIGS. 13, 14) disposed at respective ends of the row in order to hold together the remaining spacers of the row and radially support the final (endmost) turns of the coil. Each of the first end spacers 114 (see FIG. 5) is shaped similarly to the left half of the spacer 84 shown in FIG. 11 and thus includes a pair of projections 118 forming a space 120 therebetween capable of receiving two projections 96, 96' of an adjacent spacer 84.

Figure 11:
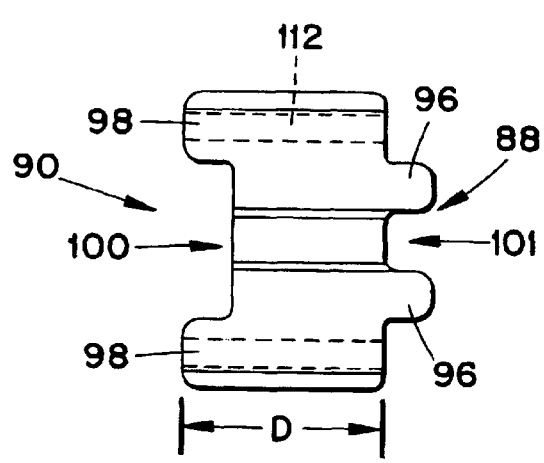
FIG. 11 is an elevational view of the spacer of FIG. 9 as seen in a circumferential (or tangential) direction with reference to a longitudinal axis of a heating element with which the spacer element is to be used.
Figure 12:
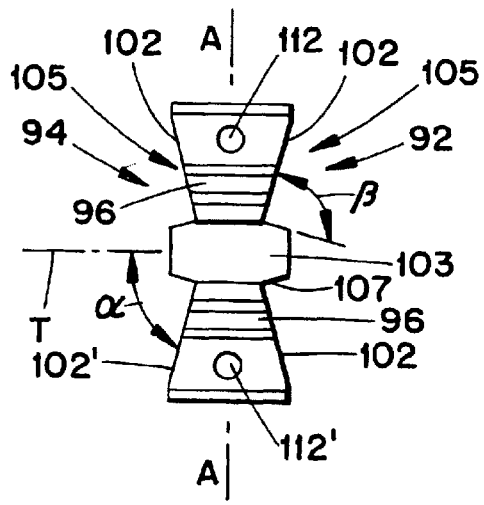
FIG. 12 is an elevational view of the spacer depicted in FIGS. 9–11, taken in a direction from the right in FIG. 11.

Each of the second end spacers 116 is shaped similarly to the right-half of the spacer 84 shown in FIG. 11 and thus includes a pair of projections 122 forming a space 124 therebetween capable of receiving a respective final turn of the heating element.

The first and second end spacers 114, 116 include inclined (beveled) side portions 102, 102' corresponding to those of the spacers 84, for reasons to be explained.

Each of the first and second end spacers includes a recess 126 facing outwardly away from the heating element for the purposes of receiving a respective row-terminating peg 122 that, subsequent to the assembly of all of the spacers of a row, is corrected, e.g., by welding, to the guide rod 109 (and optionally also the respective end spacer) so as to be axially immovable relative to the guide rod.

Not only do the end spacers 114, 116 hold together the rest of the spacers in the row, they also support the final (endmost) turns of the heating element, thereby preventing sagging of those final turns. Additionally, in the event that the heating assembly is to be used in a vertical state i.e., with the center axis of the heating element oriented vertically, the end spacers 114 or 116 disposed at the bottom of such a heating assembly will serve to support the heating assembly. The surfaces of the end spacers facing axially outwardly away from the heating element 72 could be flat (smooth), or they could be non-smooth, i.e., they could have a rough texture such as serrated surfaces 125a shown in FIGS. 13, 14 in order to maximize friction (gripping) between the end spacers and the surfaces which they engage.

When the furnace is being assembled, the heating element 72 and the spacers 84 are installed prior to the installation of the insulation. A first thin layer 130 of insulation is provided over the heating element 72. This insulation could be comprised of about 50% alumina and the balance silica. This first thin insulation layer can be formed in a number of ways, including a wet process wherein a blanket of material is formed and then strips 132 of the blanket are laid lengthwise along the heating element between the rows of spacers (see FIG. 4). An outer surface 131 of the first layer is substantially flush with radially outer surfaces 134 of the spacers 84. Then, a second layer of insulation 140 is applied to cover the first layer 130. The second layer 140 is applied in the form of strips 142 over the first layer of insulation material in an offset manner such that the seams 144 between adjacent strips 42 are circumferentially offset from the spacer rows 82.

The second insulating layer 140 could be about 80% alumina and the balance silica. After this second layer 140 is applied in a manner similar to that of the first layer, subsequent layers can be applied over the second layer. These subsequent layers are comprised of conventional insulating material. Once this has been accomplished, the housing 22 (FIG. 1) which in a preferred embodiment is comprised of stainless steel is applied over the outermost layer of insulation in such a way as to compress the insulation from a density of about six to ten pounds per square foot to a density of about fourteen to eighteen pounds per square foot. This compression holds the heating element, the spacers, and the insulation together as a rigid unit. If the insulation has been applied as a wet blanket, the heating element is energized in order to dry out the insulation.

It will be appreciated that the circumferential ends of the strips 132 of the first insulation layer enter the radial undercuts 105 formed by the inclined circumferential side portions of the spacers 84, 114, 116, 102. That is, the first layer 130 is applied wet and rolled to be compressed. The rolling action forces the circumferential ends of the insulation tightly into the undercuts 105. Once the insulation 130 dries, it hardens and becomes positively entrained between the adjacent spacer rows 82.

The compressed insulation tends to bear tightly against the side portions 102 not only in the circumferential direction, but also in a radial outward direction-due to the fact that those surfaces are inclined so as to form an undercut This forms a superior heat seal between the insulation and the spacers.

In the event that the first insulation layer shrinks with age and temperature cycling, resulting in the circumferential ends of that layer pulling circumferentially away from, or otherwise deteriorated from, the side portions 102 of the spacers 84, the resulting gaps will not extend radially relative to the axis of the heating element, since the side portions 102 are inclined relative to the radial direction. This serves to disrupt any radiant heat loss that might tend to occur through the gaps, since the radiant energy tends to be directed radially. Also, since the seams 144 of the second layer 140 of insulation are circumferentially offset relative to the spacer rows, those seams 144 cannot form extensions of the gaps and thus further minimize heat losses.

In addition, due to the undercuts, the insulation is able to better support the spacer rows, and thus the coils of the heating element.

The spacers 84 are provided with the radially inner surface portions 102' to ensure that the spacers cannot be installed upside-down. That is, the spacers are invertible so that there will be undercuts 105 disposed in the proper positions regardless of the spacer orientation. If this invertability feature is not desired, then the inclined surface portions 102' can be eliminated, i.e. only the surface portions 102 would be inclined.

Each spacer 84 has a dimension D (FIG. 11) which defines a pitch between adjacent turns of the heating element 72. It is not necessary that the dimension D be equal for all of the spacers 84 of a given row 82. By varying the dimensions D in each row, the space between some turns of the heating element will differ from others, to vary the spacing between some turns of the coil, and thus produce desired thermal conditions within the furnace.

Figure 15:
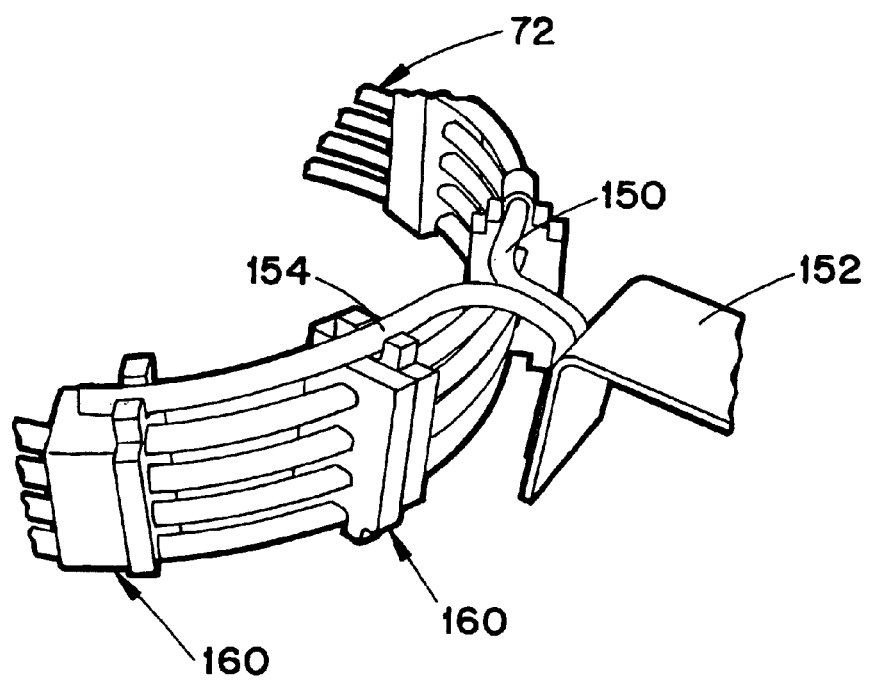
FIG. 15 is a fragmentary view of an end of a heating coil, showing a coil extender mounted thereon.

Depicted in FIG. 15 is the end of the heating coil 72 showing its free end 150 connected to an electrical lead 152. In order to prevent sagging of the free end/lead 150, 152, a helical coil extension 154 is attached to the coil end either directly, or indirectly by being attached directly to the lead 152. The extension 154 defines a short extension of the coil end 150 in the circumferential direction. The extension 154 is supported by two rows of spacers 160 (which are shown without their respective end spacers) in order to prevent the free end of the coil from sagging. The spacers could be of the type described earlier herein. This feature can be used with horizontal or vertical furnaces.

It will be appreciated that the present invention provides a novel retention mechanism which is easily installed, supports the endmost coil turns, and cooperates with the insulation in a manner minimizing heat losses.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. An electric furnace comprising:

a helical heating element;

rows of spacers for maintaining a spacing between adjacent turns of the heating element, each row of spacers extending from one end of the heating element to an opposite end of the heating element, the rows of spacers being circumferentially spaced apart with reference to a center axis of the heating element, each spacer including circumferentially facing side surfaces defining radial undercuts; and thermal insulation extending around the outside of the heating element, the insulation including circumferentially spaced portions each disposed within a respective space defined between two adjacent rows of spacers and engaging the radial undercuts of the spacers of the two rows.

2. The electric furnace according to claim 1, wherein each row of spacers includes intermediate spacers and two end spacers, wherein the end spacers support respective final turns of the heating element.

3. The electric furnace according to claim 2 further including guide rods extending parallel to the center axis of the heating element, the guide rods being spaced apart circumferentially with respect to the center axis, each guide rod extending through holes formed in the spacers of a respective row.

4. The electric furnace according to claim 3 further including terminating components disposed at respective ends of each guide rod and engaging an axially outer surface of respective end spacers, the terminating components being connected to the respective guide rod to be axially immovable relative thereto.

5. The electric furnace according to claim 3 wherein axially outer surfaces of the respective end spacers are smooth.

6. The electric furnace according to claim 3 wherein axially outer surfaces of the end spacers are of a rough texture.

7. The electric furnace according to claim 1 wherein the axial undercuts constitute a first par of axial undercuts; the circumferentially facing side surfaces of each spacer further including a second pair of radial undercuts, wherein the spacers are invertible.

8. The electric furnace according to claim 1 wherein each spacer includes two axially facing side surfaces, one of the axially facing side surfaces including a first recess, and the other axially facing side surface including a pair of radially spaced projections fitted within a first recess of an adjacent spacer, each turn of the heating element disposed within a second recess formed between the two projections.

9. The electric furnace according to claim 8 wherein each spacer includes a through-hole extending parallel to the axis and spaced radially from the first recess, and a guide rod extending through the through-holes of the spacers of each row of spacers.

10. The electric furnace according to claim 1, wherein the thermal insulation constitutes a first layer of thermal insulation and further including a second layer of thermal insulation extending around a radial exterior of the first layer, the second layer comprising circumferentially adjacent sections of insulation which form seams at their junctions, the seams being circumferentially offset from the rows of spacers.

11. The electric furnace according to claim 1 wherein a free end of the heating element is attached to an electrical lead, and further including a helical coil extension attached to the coil end and supported by at least one of the rows of spacers to prevent sagging of the coil end.

12. An electric furnace having a helical heating element encircled by insulation, and rows of spacers for keeping turns of the heating element spaced apart by predetermined distances, each spacer including circumferential side portions facing generally in a circumferential direction of the heating element and converging toward a center region of the spacer to form a radial undercut against which the insulation abuts, the spacers of each row having through-holes extending parallel to a longitudinal axis of the heating element, and a guide rod extending through the through-holes of each row of spacers.

13. A spacer for spacing-apart the turns of a helical heating element, the spacer comprising a pair of oppositely facing first side surfaces, and a pair of oppositely facing second side surfaces; one of the first side surfaces including a pair of projections spaced apart in a first direction, the other of the first side surfaces including a recess sized to receive the projections; portions of the second side surfaces converging in a second direction parallel to the first direction to form undercuts.

14. The spacer according to claim 13 wherein each spacer includes a through-hole extending through the first side surfaces.

15. The spacer according to claim 14 wherein the converging portions of the second side surfaces constitute first portions, and the undercuts constitute first undercuts; the second side surfaces including second portions converging toward the first portions to define second undercuts for rendering the spacer invertible.

* * * * *